(12) United States Patent
Ichiza

(10) Patent No.: US 9,219,212 B2
(45) Date of Patent: Dec. 22, 2015

(54) DISPLAY APPARATUS AND TELEVISION RECEIVING APPARATUS

(75) Inventor: Tomoyuki Ichiza, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 2 days.

(21) Appl. No.: 14/364,946

(22) PCT Filed: Sep. 14, 2012

(86) PCT No.: PCT/JP2012/073650
§ 371 (c)(1),
(2), (4) Date: Jun. 12, 2014

(87) PCT Pub. No.: WO2013/088803
PCT Pub. Date: Jun. 20, 2013

(65) Prior Publication Data
US 2014/0368744 A1    Dec. 18, 2014

(30) Foreign Application Priority Data

Dec. 13, 2011 (JP) ................................. 2011-272669
Jul. 24, 2012 (JP) ................................. 2012-164174

(51) Int. Cl.
| | |
|---|---|
| H04N 5/44 | (2011.01) |
| H04N 5/50 | (2006.01) |
| H04N 3/14 | (2006.01) |
| H01L 33/64 | (2010.01) |
| G02F 1/1335 | (2006.01) |

(52) U.S. Cl.
CPC .......... *H01L 33/64* (2013.01); *G02F 1/133615* (2013.01); *H04N 5/50* (2013.01); *G02F 2001/133628* (2013.01)

(58) Field of Classification Search
CPC .... H01L 33/64; G02B 6/0073; G02B 6/0031; G02B 6/0055; G02F 1/133603; G02F 1/133615; G02F 1/133308; G02F 1/133385; G02F 2001/133317; G02F 1/1336; G02F 1/133608; G02F 1/13357; G02F 1/133628; H04N 5/50; H04N 5/64; H04N 5/7441; H04N 9/3144; H04N 5/44; H04N 5/4401
USPC ................. 348/725, 731, 739, 790, 794, 836; 362/609, 600, 611, 612, 632–634
IPC ...................................... H04N 5/44, 3/14, 5/50
See application file for complete search history.

(56) References Cited

U.S. PATENT DOCUMENTS

| | | |
|---|---|---|
| 2008/0180972 A1 | 7/2008 | Sakamoto et al. |
| 2014/0240606 A1* | 8/2014 | Tomomasa et al. ........... 348/725 |
| 2014/0340586 A1* | 11/2014 | Terashima .................... 348/790 |

FOREIGN PATENT DOCUMENTS

| | | |
|---|---|---|
| JP | 7-013133 A | 1/1995 |
| JP | 2008-186780 A | 8/2008 |
| JP | 2011-018576 A | 8/2008 |
| JP | 2008-304630 A | 12/2008 |

* cited by examiner

*Primary Examiner* — Sherrie Hsia
(74) *Attorney, Agent, or Firm* — Birch, Stewart, Kolasch & Birch, LLP

(57) ABSTRACT

Disclosed is a display apparatus, wherein a holding frame includes a placing portion which protrudes in a direction substantially perpendicular to a back surface of a display panel (a liquid crystal panel 1), and is long in a direction along a side face of the display panel (the liquid crystal panel 1), such that a heat dissipater (a heat spreader) is placed on the placing portion in a longitudinal direction thereof, the substrate (a base substrate) has information (rank information) regarding the light emitting element (a white LED) described on the other surface thereof, and the heat dissipater (the heat spreader) has an opening portion (a window portion 46) formed in a surface thereof to which the substrate (the base substrate) is fixed at a position corresponding to a position in which the information (the rank information) is described.

8 Claims, 20 Drawing Sheets

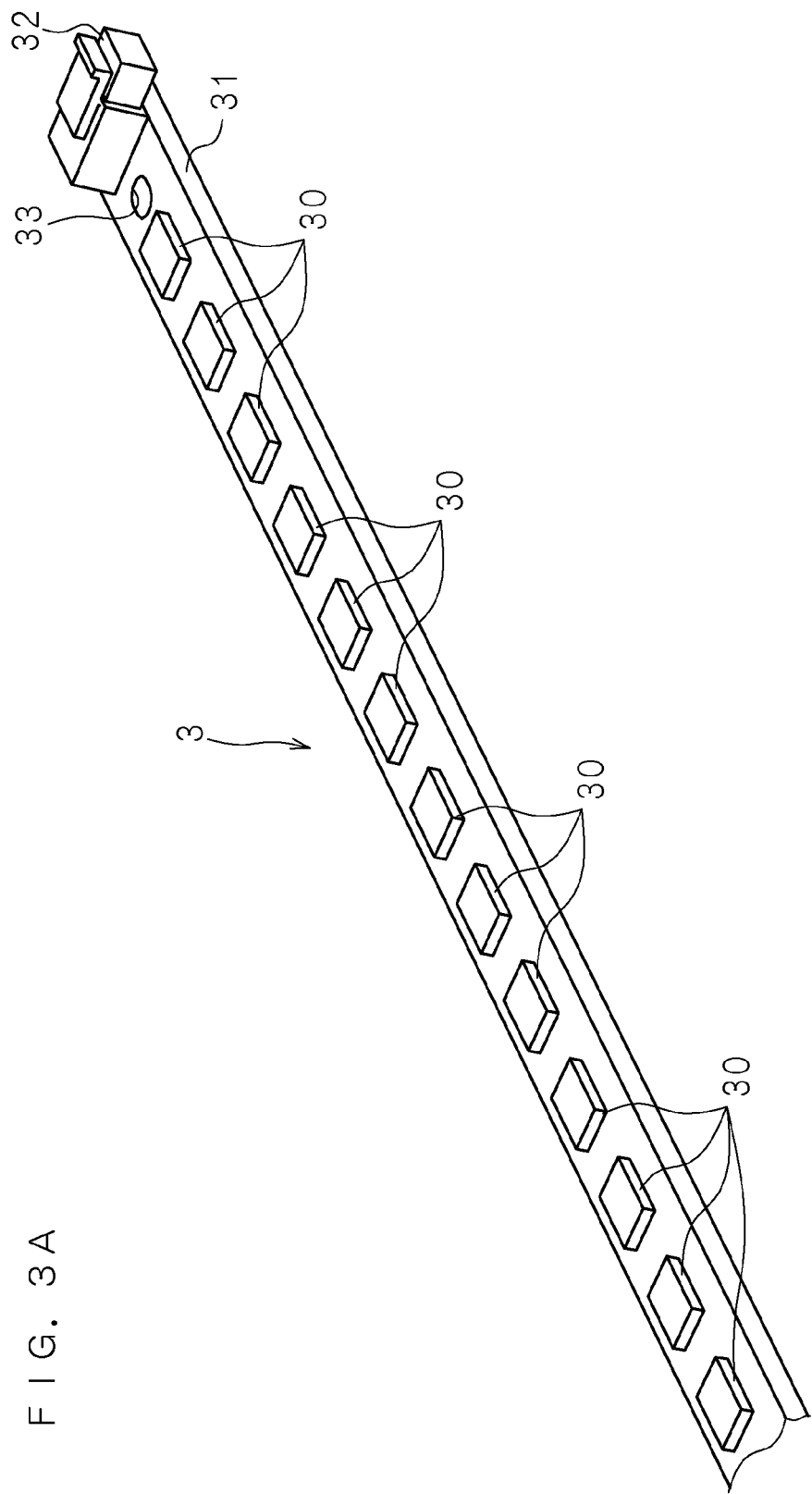

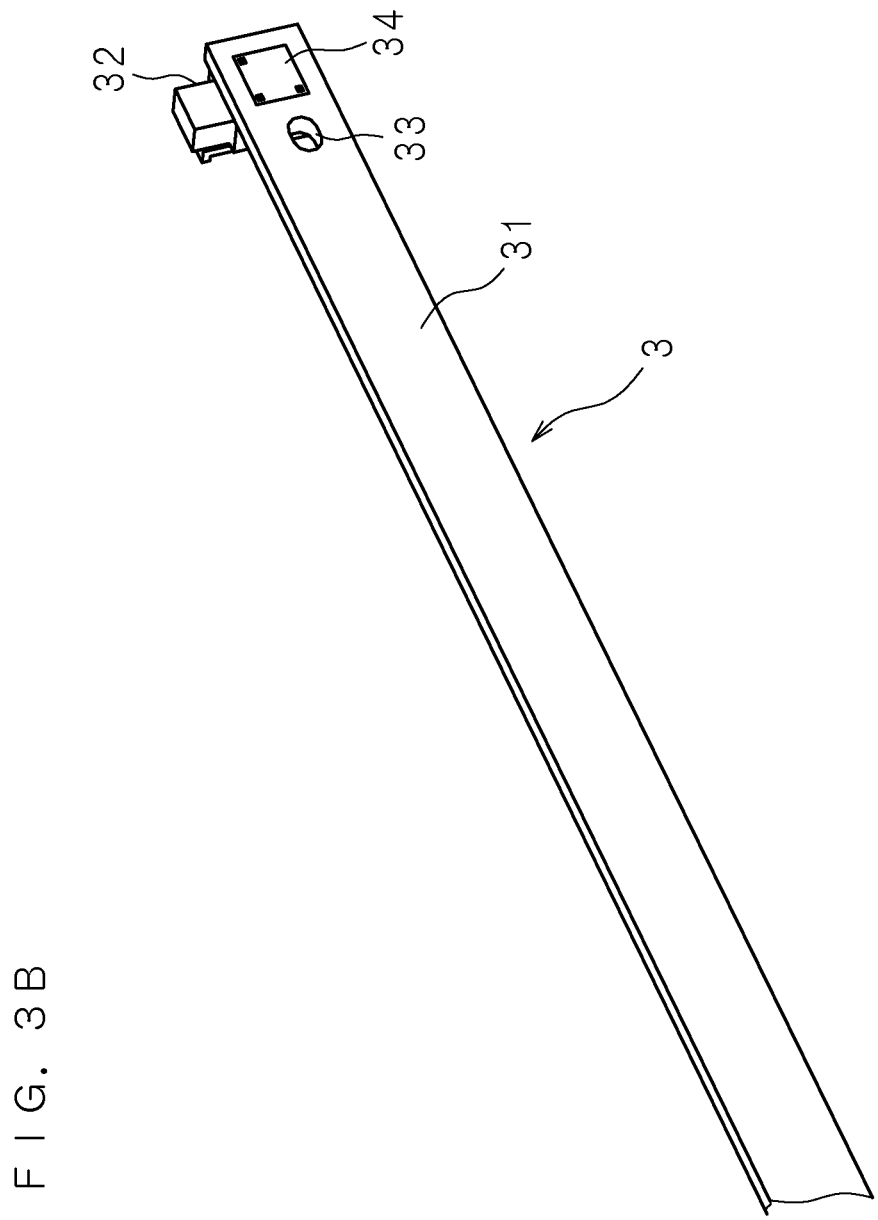

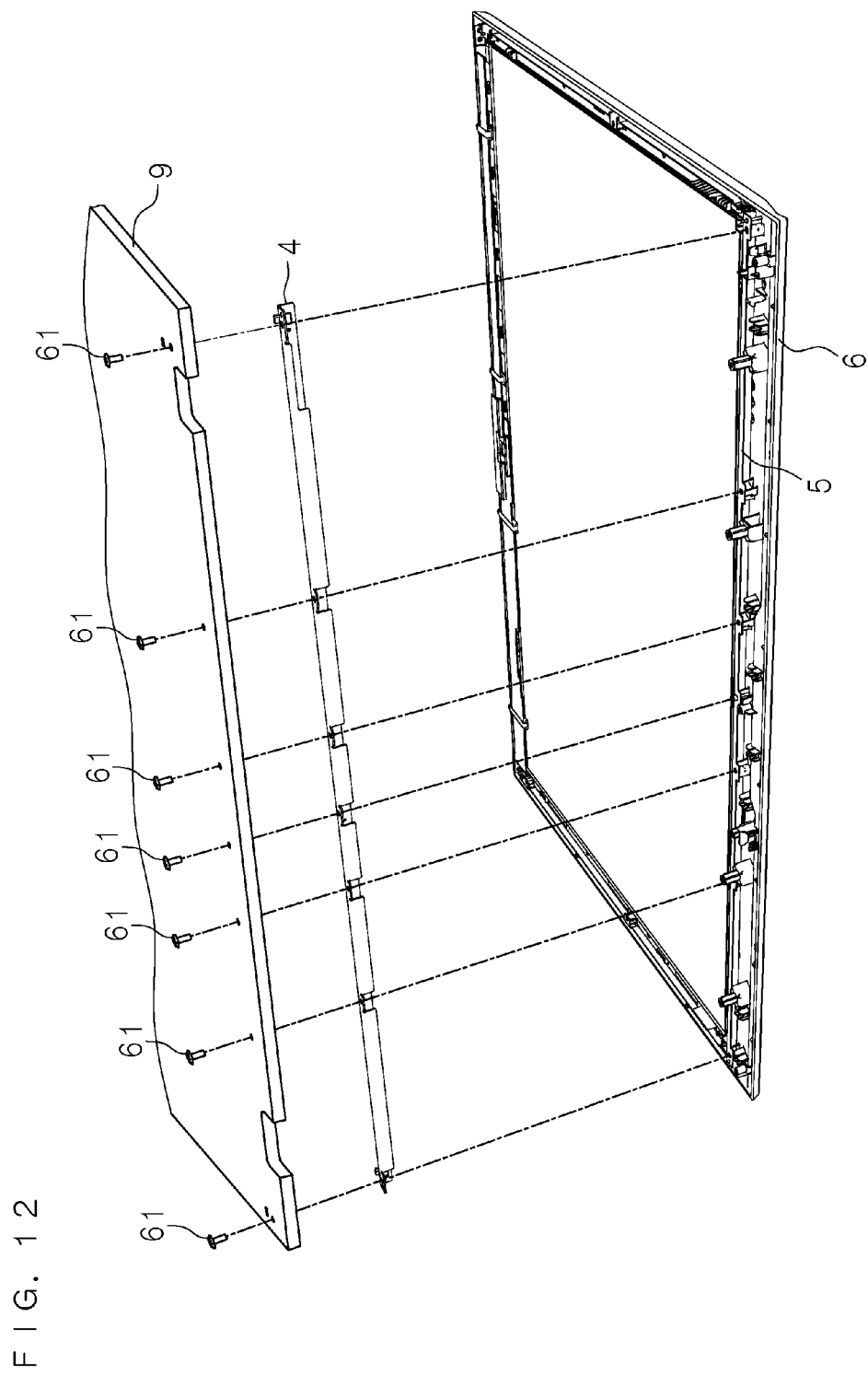

F I G. 13A
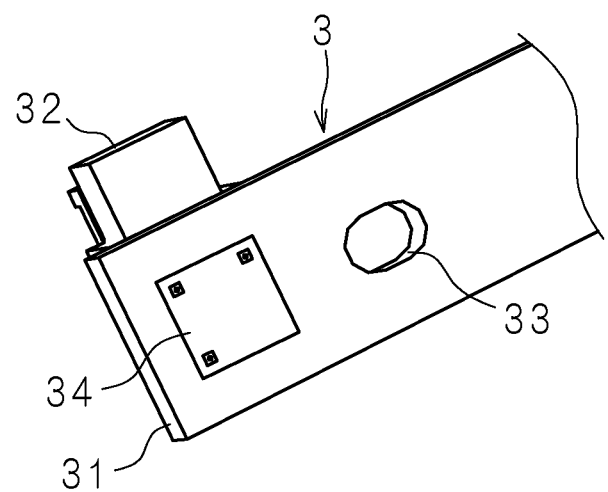

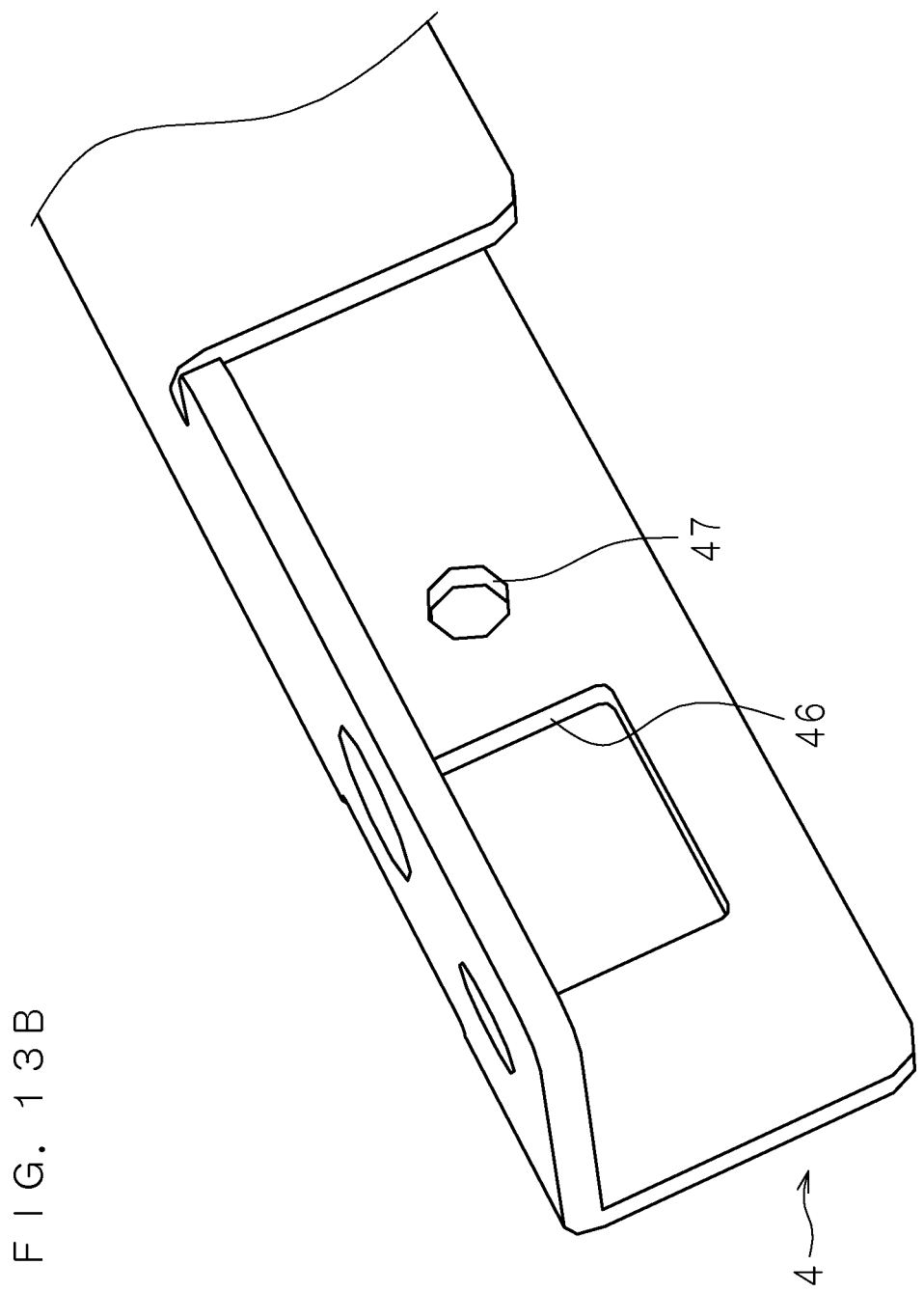

F I G. 1 8
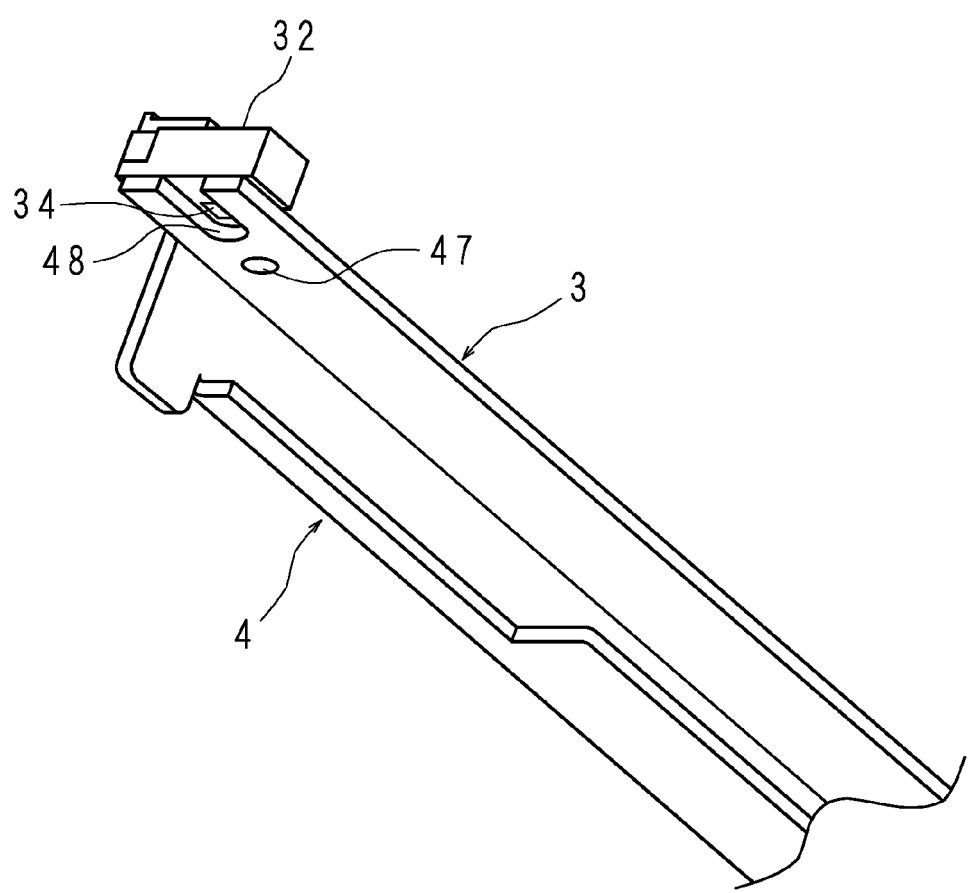

DISPLAY APPARATUS AND TELEVISION RECEIVING APPARATUS

CROSS-REFERENCE TO RELATED APPLICATIONS

This application is the national phase under 35 U.S.C. §371 of PCT International Application No. PCT/JP2012/073650 which has an International filing date of Sep. 14, 2012 and designated the United States of America.

TECHNICAL FIELD

The present invention relates to a display apparatus of an edge light system and a television (TV) receiving apparatus including the display apparatus.

BACKGROUND ART

A liquid crystal display apparatus including a liquid crystal panel as a display panel is thin and lightweight, and has low power consumption. For this reason, in recent years, the liquid crystal display apparatus is widely employed as an image display apparatus of a television receiving apparatus, a computer, and a mobile terminal.

The liquid crystal panel which is a component member of the liquid crystal display apparatus does not emit light itself. Thus, unlike a self luminous display apparatus such as a cathode ray tube (CRT), the liquid crystal display apparatus needs a planar light source unit.

As one system of light source units, there is an edge light system. The edge light system is a system in which a light guide plate and a cover to support the light guide plate are disposed on a back side of the liquid crystal panel, and a light source is disposed on a side face side of the light guide plate. The edge light system emits light which comes through the side face of the light guide plate from one surface of the light guide plate while diffusing the light in the light guide plate. Therefore, the edge light system has an advantage capable of reducing the front to back thickness of the display apparatus, compared with a direct light system in which the light source is disposed on the back side of a diffusion plate.

The edge light system, in recent years, has come to use a light emitting diode (LED) smaller than a conventional cold cathode tube as a light source. An LED used as the light source is an LED emitting white light. The white LED has a variation in emission characteristics such as chromaticity or luminance for each LED. Therefore, the manufactured white LEDs are managed by being divided into a plurality of groups with respect to characteristic values. Each group is referred to as a rank. When mounting the white LED, if white LEDs having different ranks are mounted in combination, the display quality deteriorates, and therefore it is necessary to mount the white LEDs with the same rank on an LED substrate.

Further, in such a case that the LED substrate which has been mounted and used is exchanged or repaired (that is, maintained) due to failures thereof, an LED substrate on which the white LEDs having the same rank as the white LEDs mounted on the failed LED substrate is required to be found. However, finding this from a plurality of manufactured LED substrates is a difficult task requiring a great deal of effort.

In order to solve the above-described problem, Japanese Patent Application Laid-Open No. 2011-18576 describes a display apparatus in which ranks of a plurality of white LEDs are recorded on a surface of each LED substrate on which the white LEDs are mounted or side faces of the white LEDs, each time the LED substrate is manufactured. In the above-described display apparatus, when the LED substrate fails, the rank of the white LEDs mounted on the LED substrate may be obtained by reading a bar code recorded on the failed LED substrate.

BRIEF SUMMARY OF THE INVENTION

Problems to be Solved

However, in recent years, in order to increase the luminance of display, the white LEDs have been mounted at a high density, and thereby it is difficult to describe the rank information such as a bar code on a white LED mounting surface (an LED substrate surface). Further, since the white LEDs have also been downsized with the thinning of the display apparatus, it is also difficult to describe the rank information on the side faces of the white LEDs. Therefore, the rank information has no choice but to be described on a back surface (a surface opposite to the white LED mounting surface) of the LED substrate.

On the other hand, when driving the white LED so as to emit light at high luminance, the white LED reaches a high temperature, and thus may not only affect the other parts, but also the white LED itself may be damaged by the heat. Therefore, when the white LED is used as a light source, providing a heat dissipation structure is essential. As one method of heat dissipation, attaching a heat dissipater made of metal such as aluminum on the back surface of the LED substrate is performed.

Accordingly, when the LED substrate is attached to the heat dissipater, the rank information is hidden by the heat dissipater. In order to confirm the rank information, it is necessary to remove the heat dissipater from the LED substrate, however during this process the LED substrate may be damaged due to the thin thickness and low stiffness thereof.

In consideration of the above-described circumstances, it is an object of the present invention to provide a display and the like apparatus for which it is easy to confirm rank information of white LEDs without removing a heat dissipater.

Means to Solving the Problem

According to an embodiment of the present invention, there is provided a display apparatus including: a substrate on which a light emitting element to supply light to a display panel for displaying an image on a front side thereof is mounted at one surface the substrate; a heat dissipater configured to mount the substrate; and a holding frame configured to hold a peripheral edge part of the display panel, wherein the holding frame includes a placing portion which protrudes in a direction substantially perpendicular to a back surface of the display panel, and is long in a direction along a side face of the display panel, so that the heat dissipater is placed on the placing portion in a longitudinal direction thereof, the substrate has information regarding the light emitting element described on another surface thereof, and the heat dissipater has an opening portion formed in a surface thereof to which the substrate is fixed at a position corresponding to a position in which the information is described.

According to the present invention, the display apparatus includes: the substrate on which the light emitting element to supply light to the display panel for displaying an image on the front side thereof is mounted at one surface thereof; the heat dissipater configured to fix the substrate; and the holding frame configured to hold the peripheral edge part of the display panel, wherein the substrate mounted with the light emitting element has the information regarding the light emitting element described thereon. In addition, the heat dissipater has the opening portion formed therein at a position corresponding to the position in which the information is described. Therefore, the information of a light source module may be easily referred to through the opening portion, without removing the light source module from the heat dissipater.

In the display apparatus according to the present invention, a connector may be mounted on said one surface of the substrate to be connected with a conducting wire for supplying power to the light emitting element, and the information may be described on said another surface of the substrate at a position corresponding to a position in which the connector is fixed.

According to the present invention, since the information is described on the other surface of the substrate at the position corresponding to the position in which the connector is fixed, it is possible to easily specify the description position of the information using the connector as a mark.

In the display apparatus according to the present invention, the information may be described on an end portion of the substrate.

According to the present invention, since the information is described on the end portion of the substrate, it is possible to easily specify the description position of the information.

According to another embodiment of the present invention, there is provided a television receiving apparatus including: the above-described display apparatus; and a tuner unit which receives television broadcasts, wherein the display apparatus is configured to display an image relating to the television broadcasts received by the tuner unit.

According to the present invention, the substrate mounted with the light emitting element has the information regarding the light emitting element described thereon. In addition, the heat dissipater has the opening portion formed therein at a position corresponding to the position in which the information is described. Therefore, the information of the light source module may be easily referred to through the opening portion, without removing the light source module from the heat dissipater.

Effect of the Invention

According to the present invention, the information regarding the light emitting element is described on the substrate mounted with the light emitting element. In addition, the opening portion is formed in the heat dissipater at a position corresponding to the position in which the information is described. Therefore, the information of the light source module may be easily referred to through the opening portion, without removing the light source module from the heat dissipater.

BRIEF DESCRIPTION OF THE DRAWINGS

FIG. 3A is a partial perspective view of a light source module.

FIG. 3B is a partial perspective view of the light source module.

FIG. 12 is an exploded perspective view of the liquid crystal TV according to Embodiment 1 of the present invention.

FIG. 13A is a partial perspective view of the light source module as seen from a lower side.

FIG. 13B is a partial perspective view of the heat spreader as seen from the lower side.

FIG. 18 is a partial perspective view of the heat spreader on which the light source module is placed as seen from the side face thereof.

BEST MODE FOR CARRYING OUT THE INVENTION

Hereinafter, exemplary embodiments of the present invention will be described in detail with reference to the accompanying drawings illustrating the embodiments thereof. Herein, a liquid crystal television (hereinafter referred to as a "liquid crystal TV") including a display apparatus will be described as an example.

Embodiment 1

Figure 1:
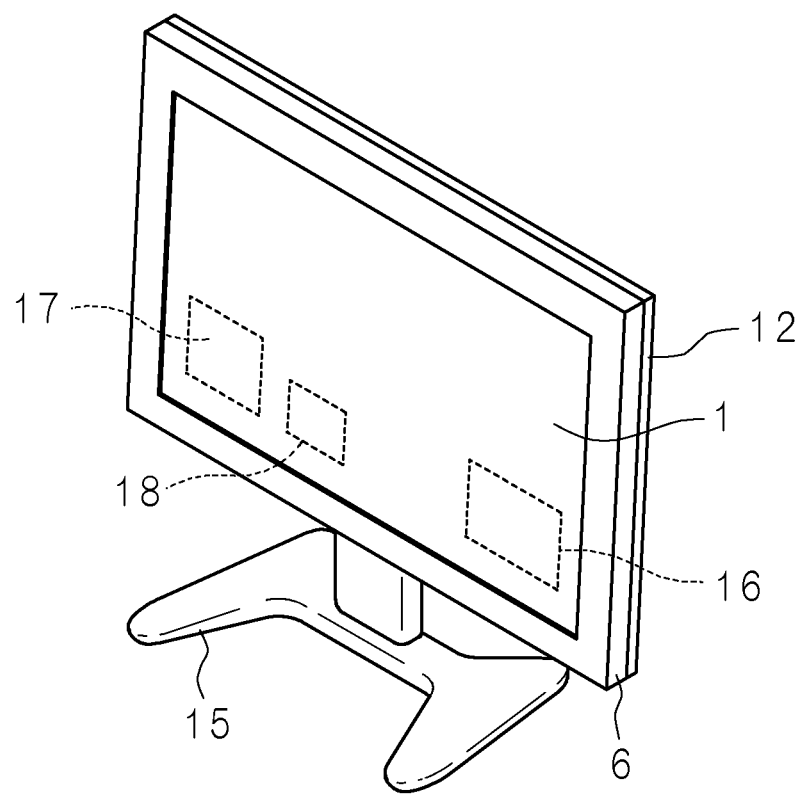
FIG. 1 is a perspective view illustrating an appearance of a liquid crystal TV according to Embodiment 1 of the present invention.

FIG. 1 is a perspective view illustrating an appearance of a liquid crystal TV according to Embodiment 1 of the present invention. The liquid crystal TV includes a liquid crystal panel 1 (a display panel), a front cabinet 6, a rear cabinet 12, a stand 15, a tuner unit 16, an image processing unit 17, and a power control unit 18. The liquid crystal panel 1 is formed in a substantially rectangular shape, and displays an image on a front side thereof. The front cabinet 6 is a rectangular-shaped frame, and covers a peripheral edge of the liquid crystal panel 1 from a front side. The rear cabinet 12 covers a back side of the liquid crystal panel 1. The stand 15 is placed on a flat surface such as a table to support the liquid crystal TV in an upright state.

The tuner unit 16 receives television broadcasts, and extracts a broadcast signal. The image processing unit 17 extracts image information from the broadcast signal. An image is displayed on the liquid crystal panel 1 based on the extracted image information. The power control unit 18 supplies power of a predetermined voltage to the respective units of the liquid crystal TV.

In the following description, a side in which the liquid crystal panel 1 of the liquid crystal TV is disposed will be referred to as a front side, and a side opposite to the front side will be referred to as a back or rear side. The left and right of liquid crystal panel 1 will be referred to as a left side and a right side from a viewer's position of facing the same. In addition, the upper and lower of the liquid crystal panel 1 will be referred to as an upper side and a lower side from the viewer's position of facing the same.

Further, in the description for each component of the liquid crystal TV, unless otherwise particularly described, it will be described in a direction in the state in which each component is assembled.

Figure 2:
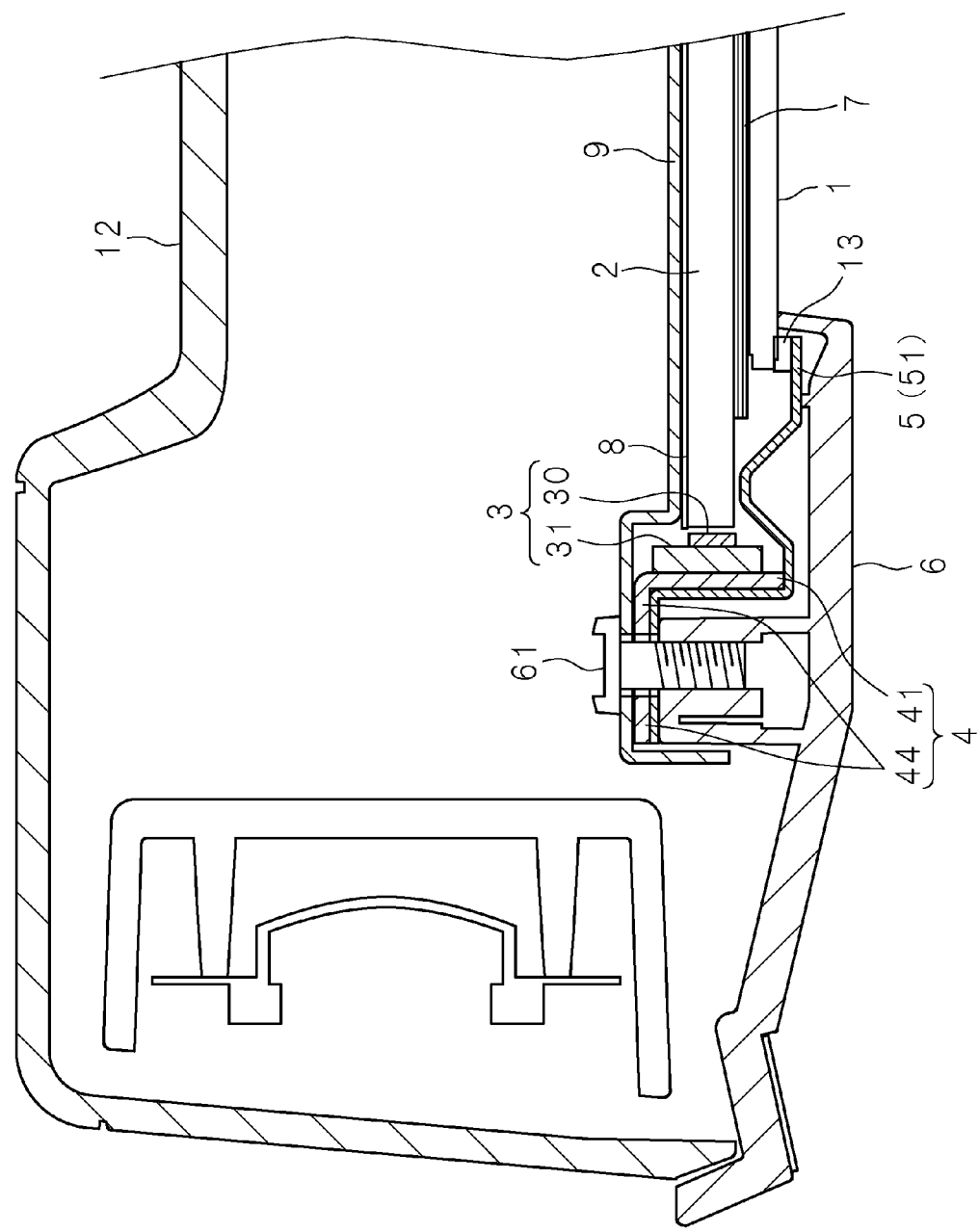
FIG. 2 is a vertical sectional view of major parts of the liquid crystal TV.

FIG. 2 is a vertical sectional view of major parts of the liquid crystal TV. FIG. 2 illustrates the liquid crystal TV with the front side facing down. In the liquid crystal TV of Embodiment 1 of the present invention, a light guide plate 2 is arranged on the back side of the liquid crystal panel 1 to be sandwiched between a lens system sheet group 7 from the front side and a light reflection sheet 8 from the back side. A light source module 3 is disposed to face a side face of the light guide plate 2 in a longitudinal direction thereof, and includes a base substrate 31 (a substrate) on which white LEDs 30 (light emitting elements) are mounted. The light source module 3 is fixed to a surface 41 of a heat spreader 4 (a heat dissipater) parallel to a side edge of the light guide plate 2. Further, the heat spreader 4 is fixed to a surface (a placing part) of a holding frame 5 parallel to the light guide plate 2. The liquid crystal panel 1, the heat spreader 4, and the like are sandwiched between the holding frame 5 on the front side of the liquid crystal panel 1 and a backlight chassis 9 on the back side of the liquid crystal panel 1, and are fixed to the front cabinet 6 by a screw 61.

The light guide plate 2 may be made of synthetic resin such as acrylic resin, polycarbonate resin, methacrylic resin, cyclic polyolefin, or the like, and is formed in a substantially rectangular shape.

The backlight chassis 9 is formed in a substantially rectangular shape with a metal plate, for example, a steel plate. The backlight chassis 9 covers the liquid crystal panel 1, the light guide plate 2, the light source module 3, and the like from the back side of the liquid crystal TV.

An elastic member 13 is disposed at a portion where the holding frame 5 and the liquid crystal panel 1 are in contact with each other. The elastic member 13 securely fixes the liquid crystal panel 1, and prevents the surface of the liquid crystal panel 1 from being damaged by the holding frame 5. The front cabinet 6 covers the holding frame 5.

In the liquid crystal TV having the above-described configuration, light emitted from the white LEDs 30 enters from the side edge of the light guide plate 2. Since the light reflection sheet 8 is laminated to the back side of the light guide plate 2, the light advancing toward the back side direction of the light guide plate 2 is reflected by the light reflection sheet 8. The liquid crystal panel 1 is irradiated with the light reflected by the light reflection sheet 8 from the back side. The liquid crystal panel 1 is controlled so as to display an image on the front side of the liquid crystal panel 1.

Figure 4:
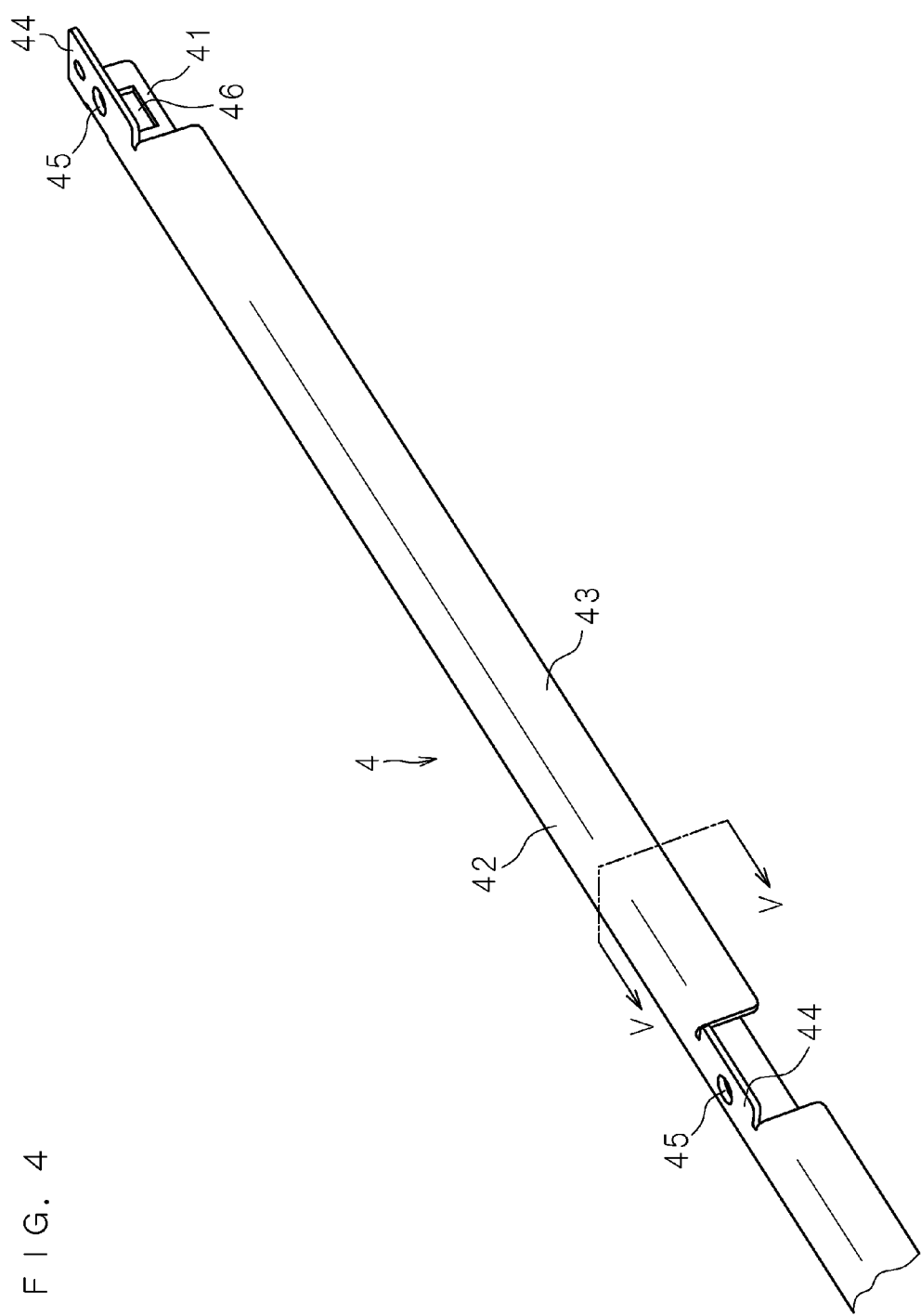
FIG. 4 is a partial perspective view of a heat spreader as seen from a rear lower side.
Figure 5:
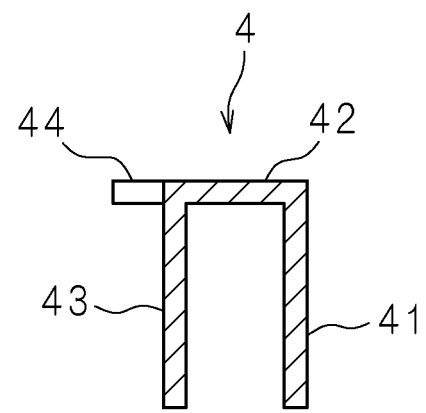
FIG. 5 is a cross-sectional view taken on line V-V in FIG. 4.
Figure 6:
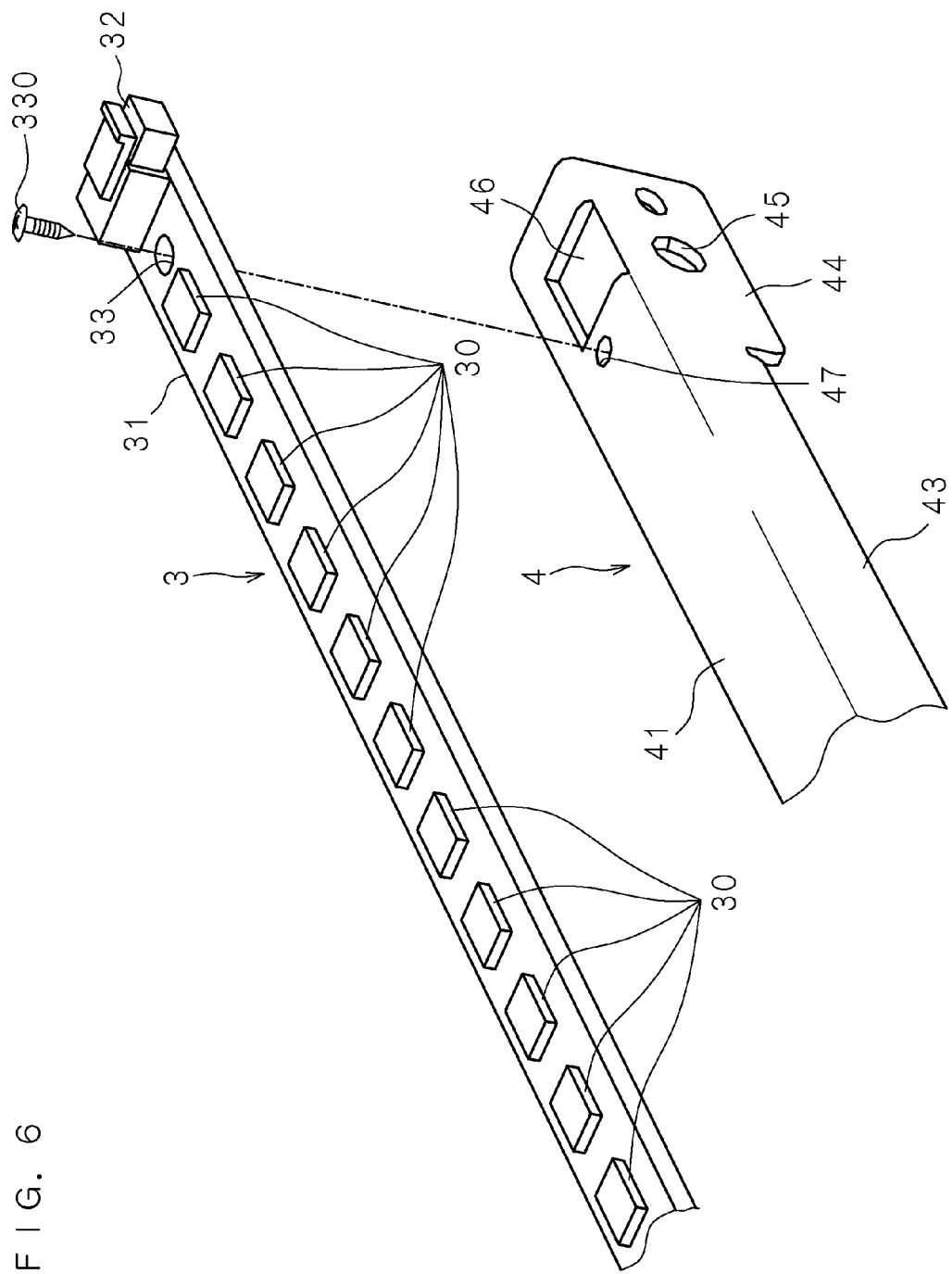
FIG. 6 is a partial perspective view of the light source module and the heat spreader as seen from a rear upper side.
Figure 7:
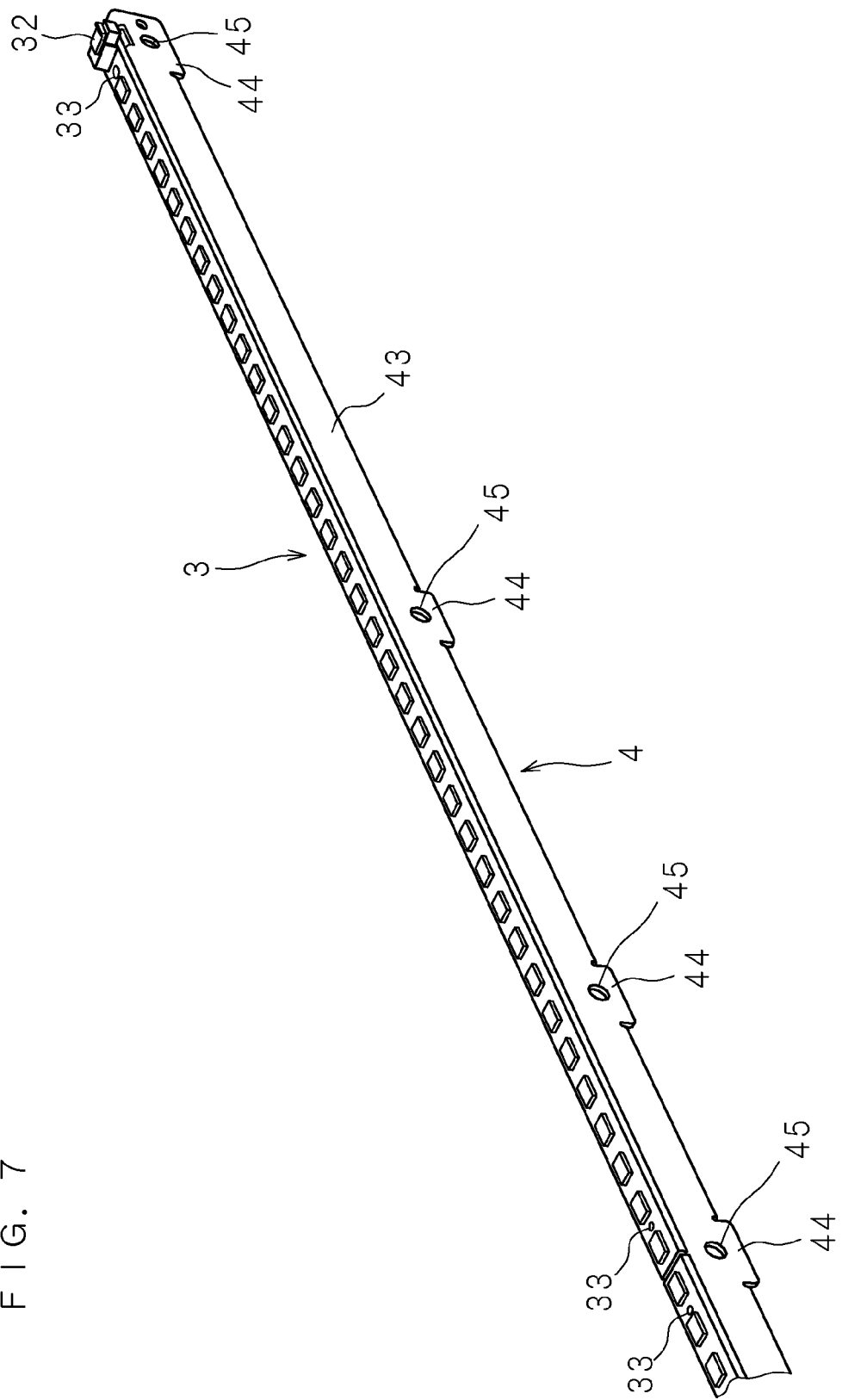
FIG. 7 is a partial perspective view of the heat spreader on which the light source module is placed as seen from the rear upper side.
Figure 8:
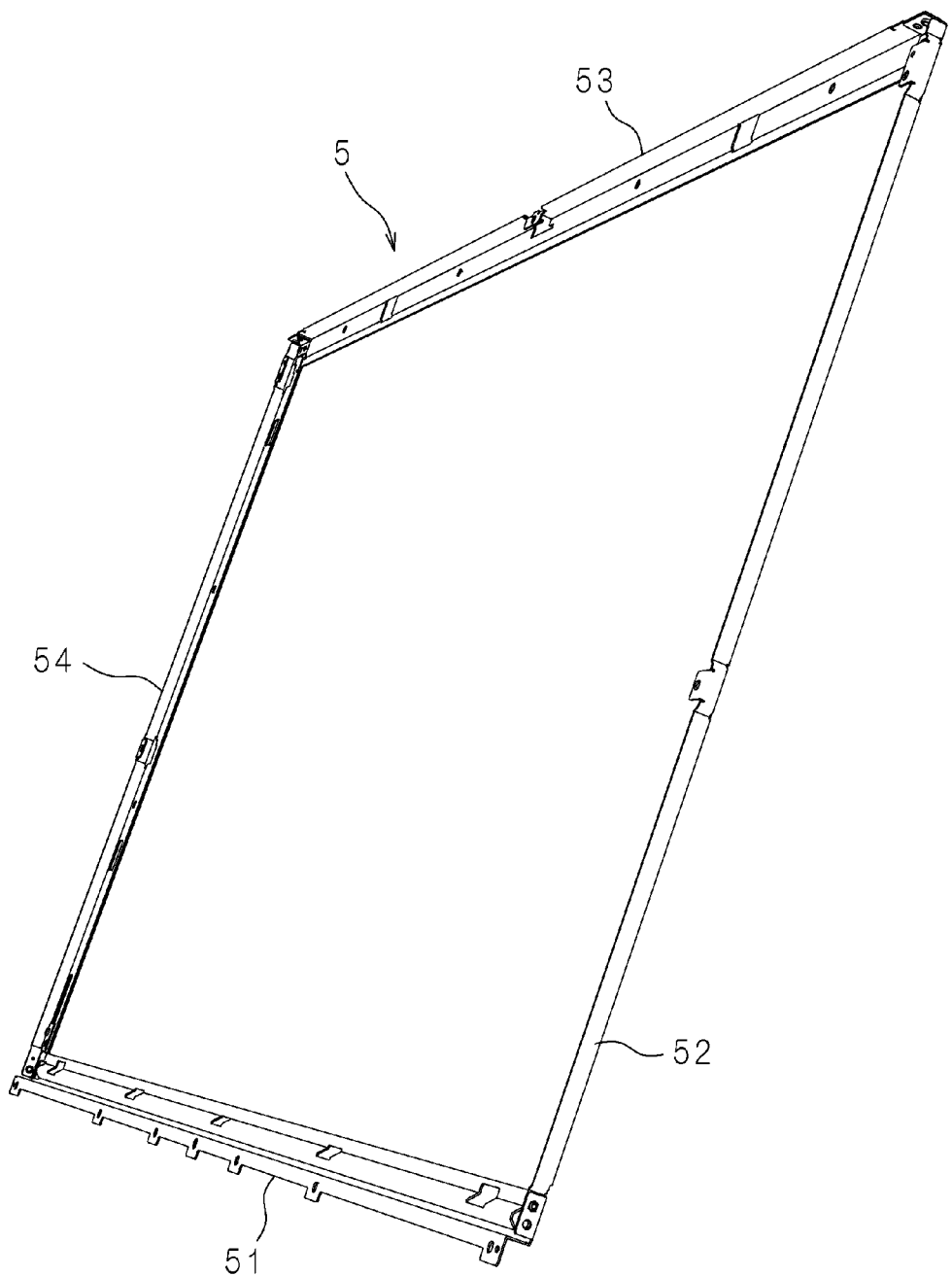
FIG. 8 is a perspective view of a holding frame as seen from the rear upper left side.

FIGS. 3A and 3B are partial perspective views of the light source module 3. Herein, FIG. 3A is a partial perspective view of the light source module 3 as seen from above the surface of the light source module. FIG. 3B is a partial perspective view of the light source module 3 as seen from the lower side of the back surface of the light source module. FIG. 4 is a partial perspective view of the heat spreader 4 as seen from a rear lower side. FIG. 5 is a cross-sectional view taken on line V-V in FIG. 4. FIG. 6 is a partial perspective view of the light source module 3 and the heat spreader 4 as seen from a rear upper side. FIG. 7 is a partial perspective view of the heat spreader 4 on which the light source module 3 is placed as seen from the rear upper side. FIG. 8 is a perspective view of the holding frame 5 as seen from the rear upper left side.

The light source module 3 includes, as illustrated in FIG. 3A, a plurality of white LEDs 30, the strip-shaped base substrate 31 on which the white LEDs 30 are mounted, and a connector 32. The white LEDs 30 are juxtaposed on one surface of the base substrate 31 in the longitudinal direction thereof. The white LEDs 30 are driven by a drive circuit (not illustrated) to emit light. The white LEDs 30 are supplied with a drive current by a cable connected to the connector 32. The connector 32 is fixed to one end of the base substrate 31. The connector 32 is provided with an adapter insertion port in a direction crossing the longitudinal direction of the base substrate 31. A terminal of the connector 32 is connected with one end of a conducting wire provided on the base substrate 31. The other end of the conducting wire is connected to terminals of the white LEDs 30, whereby power is supplied to the white LEDs 30.

As illustrated in FIG. 3B, rank information 34 (information regarding the light emitting elements) is described on the other surface of the base substrate 31 at a side opposite to the installation position of the connector 32. The rank information 34 is, for example, a string of letters including a bar code, two-dimensional code, pictogram, or alphanumeric characters. The rank information 34 is information indicating the rank of the white LEDs 30 mounted on the light source module 3. The rank information 34 may include identification information (ID, product serial number, lot number, and the like) corresponding to the rank, emission characteristic information (chromaticity, luminance, and the like) of the white LEDs 30 corresponding to the rank, or the identification information and the emission characteristic information of the white LEDs 30 corresponding to the rank.

The heat spreader 4 is a bar-shaped member as illustrated in FIG. 4. The heat spreader 4 has a cross-section formed in substantially a U shape as illustrated in FIG. 5. The light source module 3 is, as illustrated in FIG. 7, mounted on an upper portion 41 which is to be an upside when mounting as illustrated in FIG. 2. As illustrated in FIGS. 4 and 6, a rectangular-shaped window portion 46 (an opening portion) is provided in one end portion of the heat spreader 4. The window portion 46 is formed at a position to which the rank information 34 described on the back surface of the base substrate 31 is exposed, when the heat spreader 4 and the light source module 3 are fixed to each other by a screw 330 inserted into screw holes 33 and 47. As illustrated in FIG. 6, the upper portion 41 is provided with the screw hole 47. The light source module 3 is fixed to the heat spreader 4 by the screw which passes through the screw hole 33 and the screw hole 47. Herein, the screw is omitted in FIG. 7. Further, the window portion 46 is not limited to have the rectangular shape, and may be a circular, elliptical, or polygonal shape other than the rectangular shape.

As illustrated in FIG. 4, a front portion 42 of the heat spreader 4 continues to a lower portion 43 thereof. The lower portion 43 is discontinuous by being cut in several sections. A plate-shaped coupling portion 44 continuously extends downwardly from the front portion 42 in the cut section between the lower portions 43. The coupling portions 44 are formed on the opposite end portions of the heat spreader 4. The heat spreader 4 is fixed to the holding frame 5 by the screws 61 passing through screw holes 45 formed in the coupling portion 44.

The heat spreader 4 may be made of metal having a high thermal conductivity, such as aluminum. The heat spreader 4 conducts heat generated from the white LEDs 30 to diffuse the heat to the surroundings. One surface of the upper portion 41 of the heat spreader 4 contacts with the light source module 3 and the other surface thereof contacts with the holding frame 5.

As illustrated in FIG. 8, the holding frame 5 is a rectangular-shaped frame in which a lower portion member 51, a left side member 52, an upper portion member 53, and a right side member 54, which are made of metal plates such as a steel plates, respectively, are coupled by screws. The holding frame 5 holds the liquid crystal panel 1, the light guide plate 2 and the like.

Figure 9:
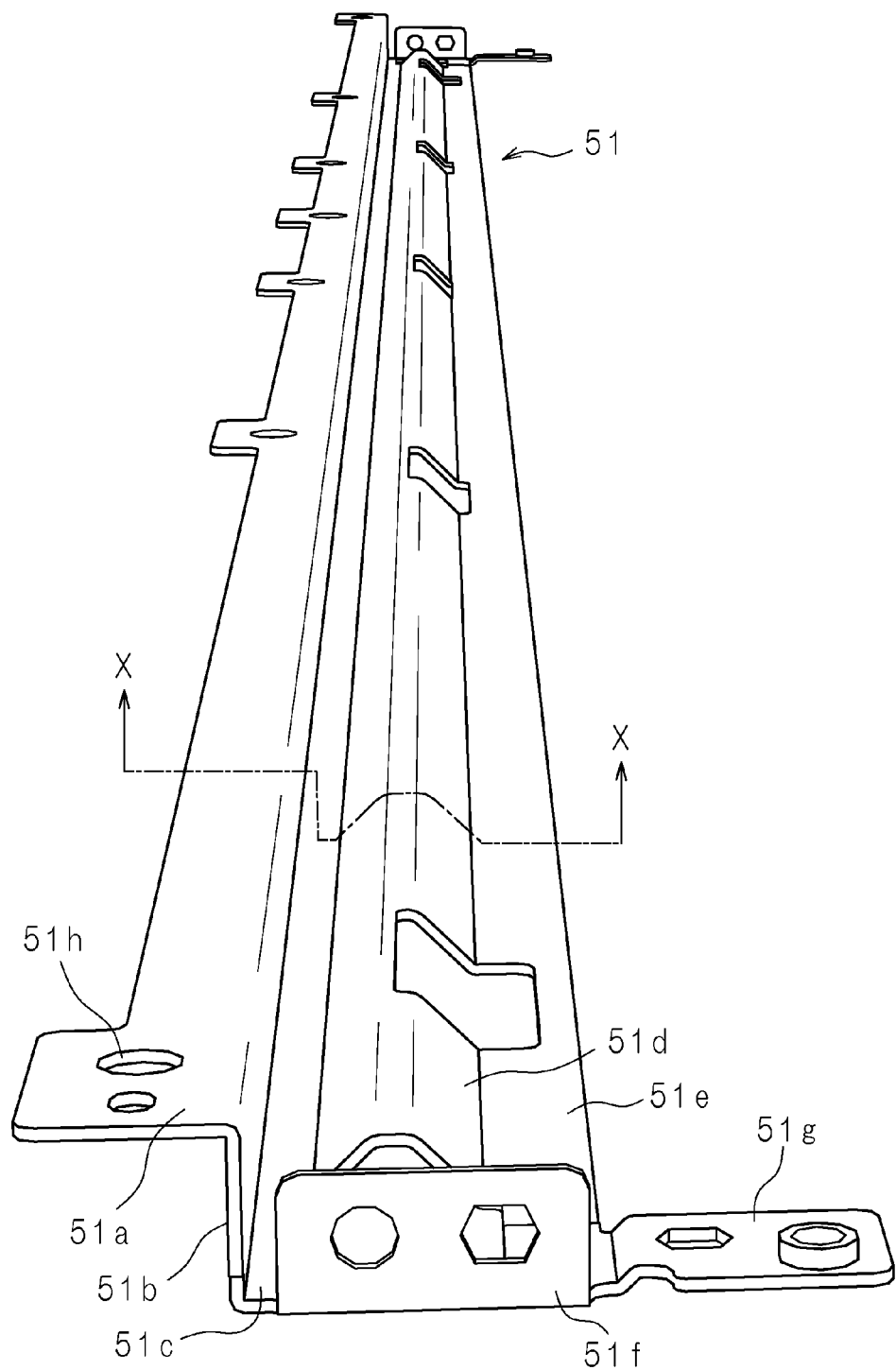
FIG. 9 is a perspective view of a lower portion member of members included in the holding frame as seen from a rear left side face thereof.
Figure 10:
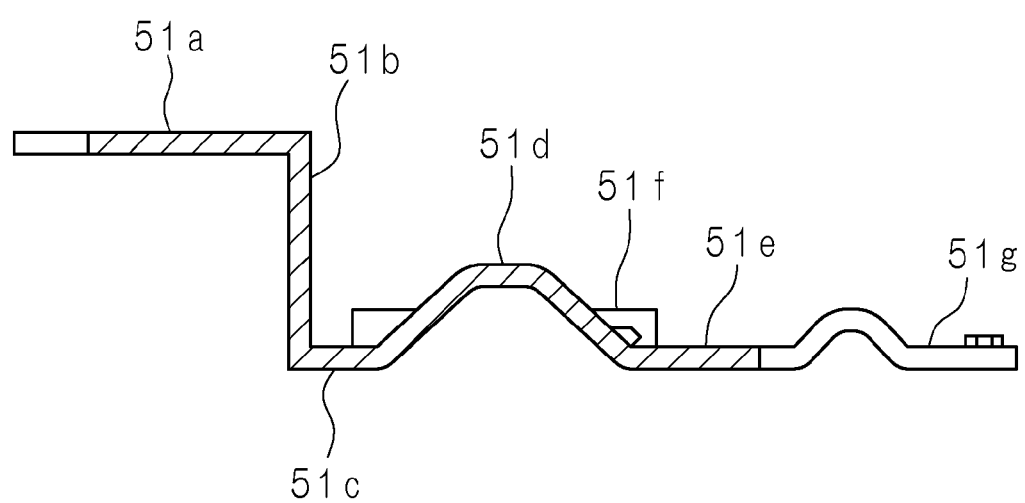
FIG. 10 is a cross-sectional view taken on line X-X in FIG. 9.
Figure 11:
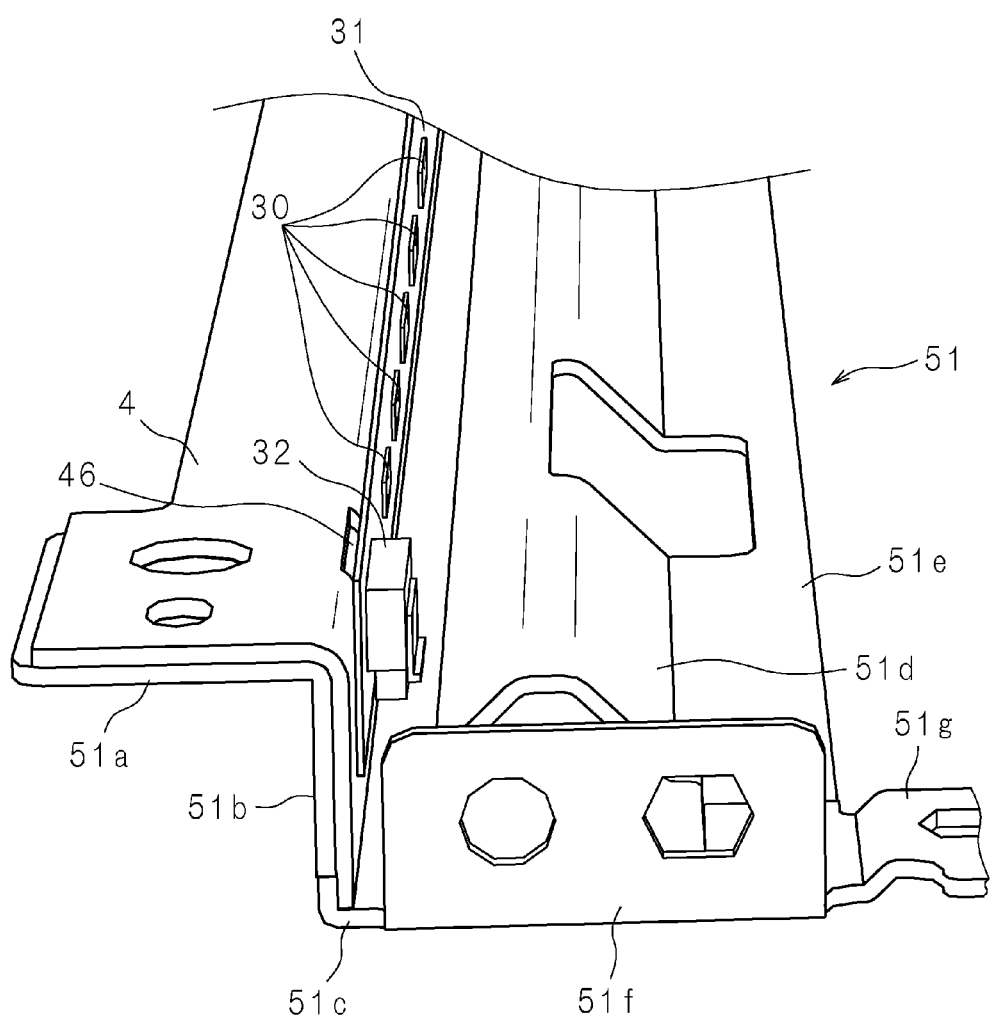
FIG. 11 is a partial perspective view of the lower portion member of the holding frame on which the heat spreader is placed as seen from the rear left side face thereof.

FIG. 9 is a perspective view of a lower portion member 51 of members included in the holding frame 5 as seen from a rear left side face thereof. The lower side in FIG. 9 is a front side of the liquid crystal TV. FIG. 10 is a cross-sectional view taken on line X-X in FIG. 9. FIG. 11 is a partial perspective view of the lower portion member 51 of the holding frame 5 on which the heat spreader 4 is placed as seen from the rear left side face thereof.

The member 51 includes a plate-shaped portion 51a which serves as a placing portion and extends upwardly from the bottom parallel to the liquid crystal panel 1, and a plate-shaped portion 51b which continues therefrom and extends to the front side. Further, the member 51 includes a plate-shaped portion 51c which continues therefrom and upwardly extends, a portion 51d which continues therefrom and protrudes to the back side, that is, to a surface contacting with the liquid crystal panel 1 of the light guide plate 2, and a plate-shaped portion 51e which continues therefrom and upwardly extends. At both ends of the right and left direction, the member 51 also include strip-shaped connection portions 51g which further extend upwardly from the plate-shaped portion 51e, and connection portions 51f which protrude to the back side.

As illustrated in FIG. 11, the upper member 51 contacts with the heat spreader 4 through the plate-shaped portions 51a and 51b. The member 51 is provided with a screw hole 51h into which the screw for fixing the backlight chassis 9 and the heat spreader 4 to the member 51 is inserted.

The connection portion 51g of the member 51 functions to connect the member 51 with the other members 52 and 54 included in the holding frame 5 by a screw.

Next, a method for assembling the liquid crystal TV according to Embodiment 1 of the present invention will be described. In a description below, the liquid crystal TV is assembled with the front side facing down.

First, the holding frame 5 is placed on the front cabinet 6. The liquid crystal panel 1 is placed on the holding frame so that an outer edge portion of the liquid crystal panel 1 contacts to an inner edge portion of the holding frame 5. Next, the lens system sheet group 7, the light guide plate 2, and the light reflection sheet 8 are placed on the liquid crystal panel 1. In addition, the heat spreader 4 with the light source module 3 fixed thereto is placed on a surface of the member 51 of the holding frame 5 parallel to the side edge of the light guide plate 2. Further, the backlight chassis 9 is placed thereon and fixed to the front cabinet 6 by the screws 61. The heat spreader 4 placed on the holding frame 5 is screwed in a manner to be sandwiched between the holding frame 5 and the backlight chassis 9.

The tuner unit 16, the image processing unit 17, and the power control unit 18 are fixed to the backlight chassis 9, and the rear cabinet 12 are covered thereon to be fixed to the front cabinet 6 by the screws.

FIG. 12 is an exploded perspective view of the liquid crystal TV according to Embodiment 1 of the present invention. FIG. 12 illustrates a manner in which the front cabinet 6, the holding frame 5, the heat spreader 4, and the backlight chassis 9 are to be fixed to each other by the screws 61. The holding frame 5 is placed on the front cabinet 6. The heat spreader 4 to which the light source module 3 is fixed is placed on the holding frame 5. The backlight chassis 9 is fixed to the front cabinet 6 to sandwich the heat spreader 4 and the holding frame 5 therebetween.

In FIG. 12, the tuner unit 16, the image processing unit 17, the power control unit 18, and the rear cabinet 12 are not illustrated.

Next, a case of referring to the rank information 34 of the white LEDs 30 will be described. When referring to the rank information, first, the rear cabinet 12 is uncovered from the liquid crystal TV. Then, the tuner unit 16, the image processing unit 17, and the power control unit 18 are removed from the backlight chassis 9. Further, as illustrated in FIG. 12, the screws 61 are unscrewed and the backlight chassis 9 is removed. In this state, the heat spreader 4 is removable from the holding frame 5.

Figure 14:
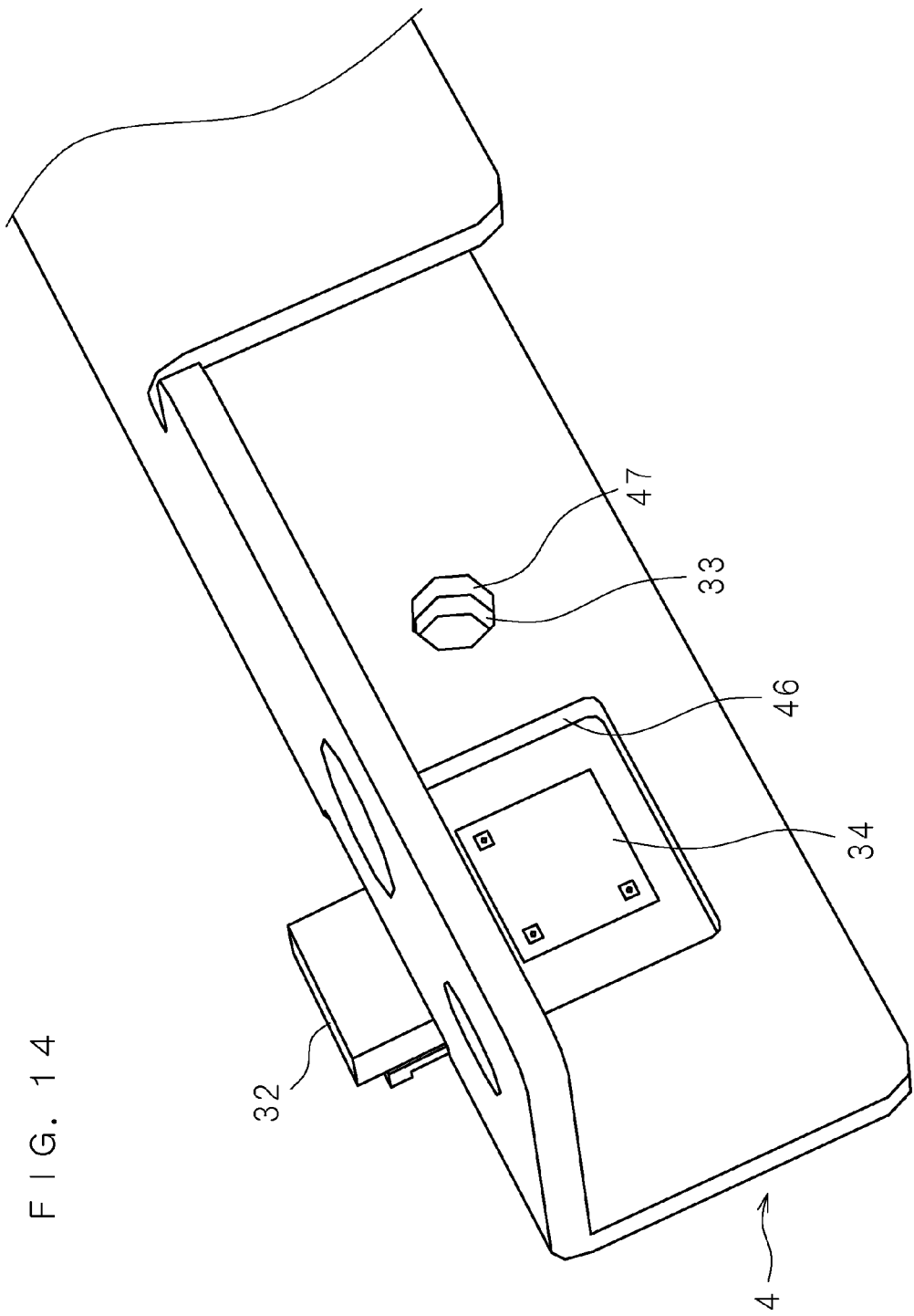
FIG. 14 is a partial perspective view of the heat spreader on which the light source module is placed as seen from the lower side.

FIG. 13A is a partial perspective view of the light source module 3 as seen from a lower side. FIG. 13B is a partial perspective view of the heat spreader 4 as seen from the lower side. FIG. 14 is a partial perspective view of the heat spreader 4 on which the light source module 3 is placed as seen from the lower side.

As illustrated in FIG. 13A, the rank information 34 is described on an end portion of the base substrate 31 at a position corresponding to the back side of the connector 32. As illustrated in FIG. 13B, the heat spreader 4 is provided with the window portion 46.

As illustrated in FIG. 14, the heat spreader 4 is provided with the window portion 46, and therefore the rank information 34 of the light source module 3 may be easily referred to therethrough, without removing the light source module 3 from the heat spreader 4. When the rank information 34 includes only the identification information corresponding to the rank, the emission characteristic information of the white LEDs 30 may be obtained by searching a database in which the rank identification information and the emission characteristic information of the white LEDs are in association with each other.

As described above, when confirming the rank information 34 of the light source module 3 for repairing or inspection, it is possible to prevent damage to the base substrate 31 due to the removing of the light source module 3 from the heat spreader 4.

In addition, since the rank information 34 is described on the back surface of the base substrate 31 at the position corresponding to the connector 32, it is possible to easily specify the description position of the rank information 34 using the connector 32 as a mark.

Furthermore, since the rank information 34 is described on the end portion of the base substrate 31, it is possible to easily specify the description position of the rank information 34.

Moreover, the rank information 34 is information in which a string of letters including a bar code, two-dimensional code, pictogram, or alphanumeric characters is described, but it may be other information as long as it represents the rank information. A sticker with rank information described thereon may be attached to the base substrate 31. The rank information may be described with fluorescent ink or fluorescent paint which is invisible by the naked eye under visible light but may be visible when irradiated with ultraviolet rays. In addition, the rank information may be represented by convexo-concave patterns formed on the surface of the substrate by processing the same.

The characteristic information of the white LEDs 30 corresponding to the rank includes the chromaticity, luminance, or the like, but it is not limited thereto, and may include relative color temperature, color rendering properties, and luminous efficiency. Further, the information is not limited to the emission characteristics, and may include electrical properties (rated voltage, consumption current or the like).

The shape of the heat spreader 4 is not limited to the above-described shapes, and may employ the shapes described below.

Modified Embodiment 1

Figure 15:
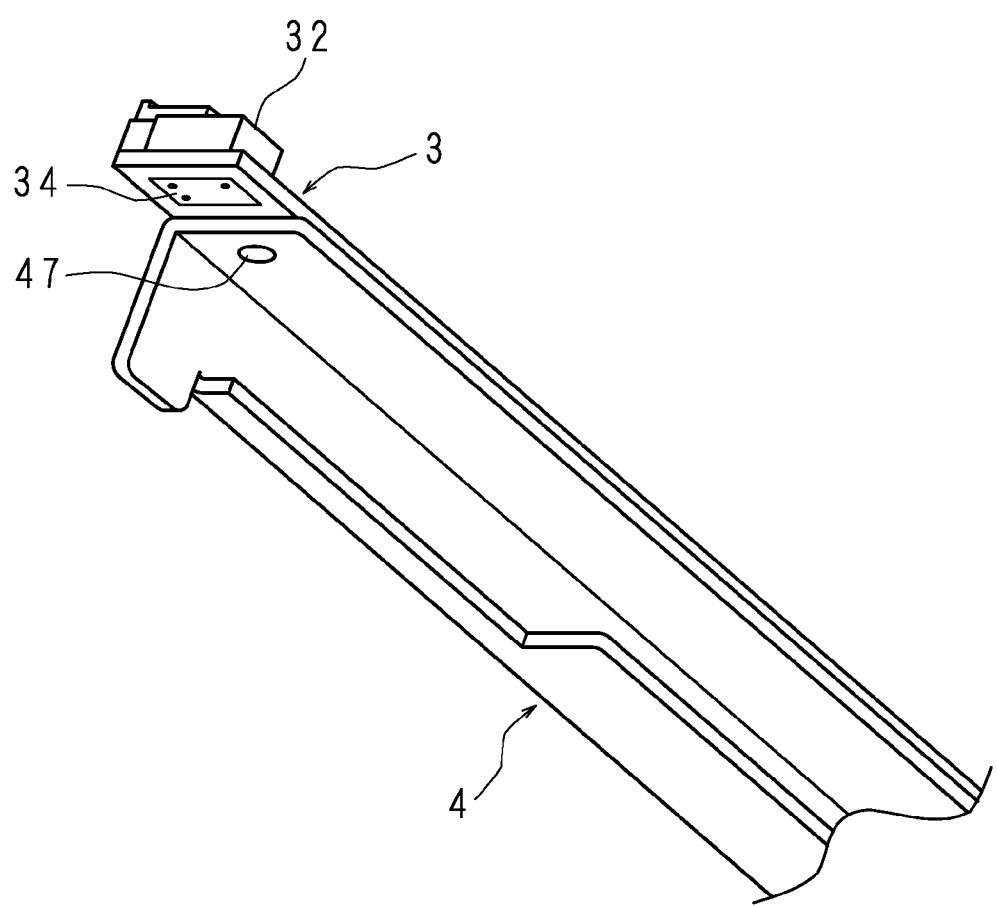
FIG. 15 is a partial perspective view of the heat spreader on which the light source module is placed as seen from a side face thereof.

In the above-described Embodiment 1, the longitudinal dimension of the heat spreader 4 is substantially twice that of the longitudinal dimension of the light source module 3. Therefore, two light source modules 3 are mounted on substantially the entire surface of a surface of the heat spreader 4 extending in the longitudinal direction thereof. In Modified Embodiment 1 of the present invention, the heat spreader 4 is shorter than the above-described heat spreader. FIG. 15 is a partial perspective view of the heat spreader 4 on which the light source module 3 is placed as seen from a side face thereof. An end portion of the light source module 3 on which the connector 32 is mounted protrudes from the heat spreader 4. In this structure, since the heating of the connector 32 portion is small, the heat spreader is not provided at the portion corresponding to the connector 32.

In Modified Embodiment 1, it is possible to reduce the member by eliminating the portion in the heat spreader 4 corresponding to the connector 32 of the light source module 3. In addition, Modified Embodiment 1 has an advantage that the rank information 34 positioned on the surface of the light source module 3 opposite to the connector 32 may be easily read. The other configurations of this embodiment are the same as that of the above-described embodiment, and therefore a description thereof will not be described.

Modified Embodiment 2

In the above-described Embodiment 1, the rank information 34 is described on the surface of the light source module 3 opposite to the connector 32. The heat spreader 4 is provided with the window portion 46, the rank information 34 may be read therethrough without removing the heat spreader 4 from the light source module 3.

Figure 16:
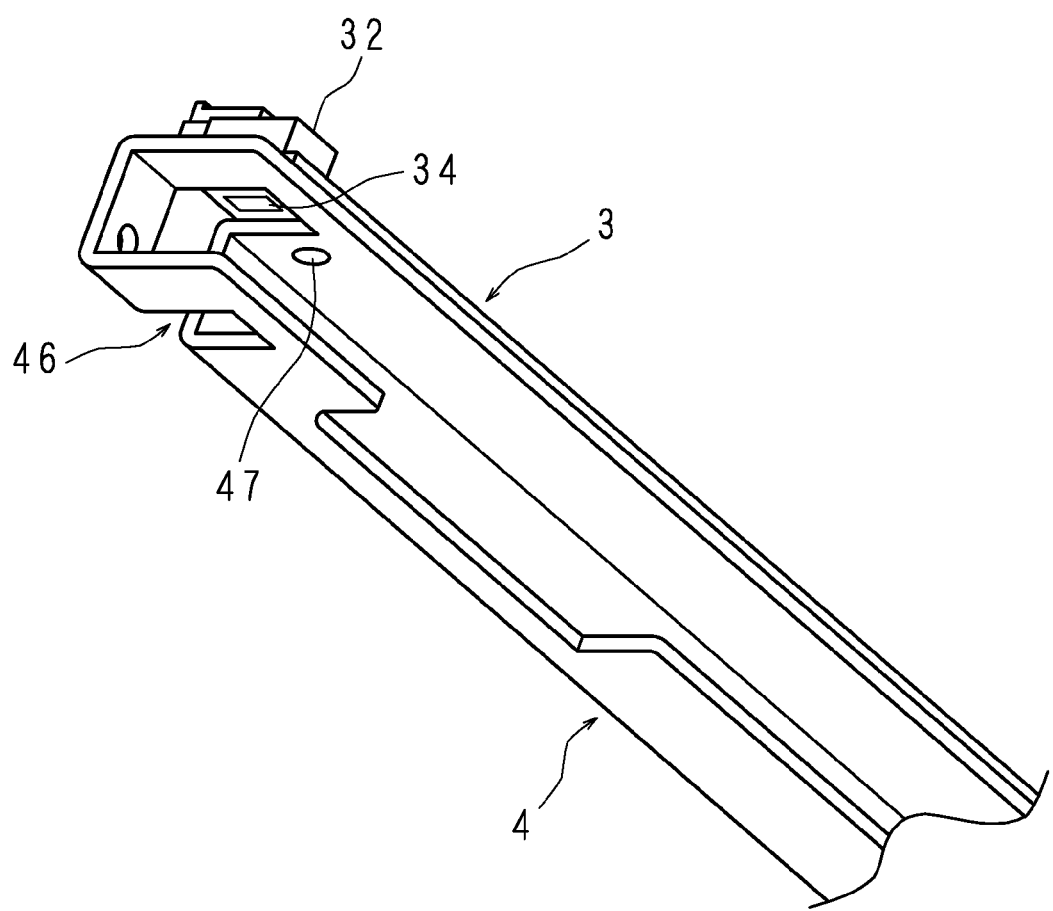
FIG. 16 is a partial perspective view of the heat spreader on which the light source module is placed as seen from the side face thereof.

In Modified Embodiment 2, in order to further easily read the rank information 34, the window portion 46 is formed over a plurality of the surfaces of the heat spreader 4. FIG. 16 is a partial perspective view of the heat spreader 4 on which the light source module 3 is placed as seen from the side face thereof. The rank information 34 is described on the surface of the light source module 3 opposite to the connector 32. The heat spreader 4 is provided with the window portion 46, so that even when the light source module 3 is mounted on the heat spreader 4, the rank information 34 may be read. In Modified Embodiment 2 of the present invention, the window portion 46 continues to not only the surface on which the rank information 34 is described but also the other surface of the heat spreader 4, so as to be provided over the plurality of surfaces. By the window portion 46 provided over the plurality of surfaces of the heat spreader 4, the rank information 34 of the light source module 3 mounted on the heat spreader 4 may be easily read. This configuration is particularly effective in the case that contents of the description will not be found unless the rank information 34 is read by the reader, such as a bar code, or two-dimensional bar code reader.

Modified Embodiment 3

Figure 17:
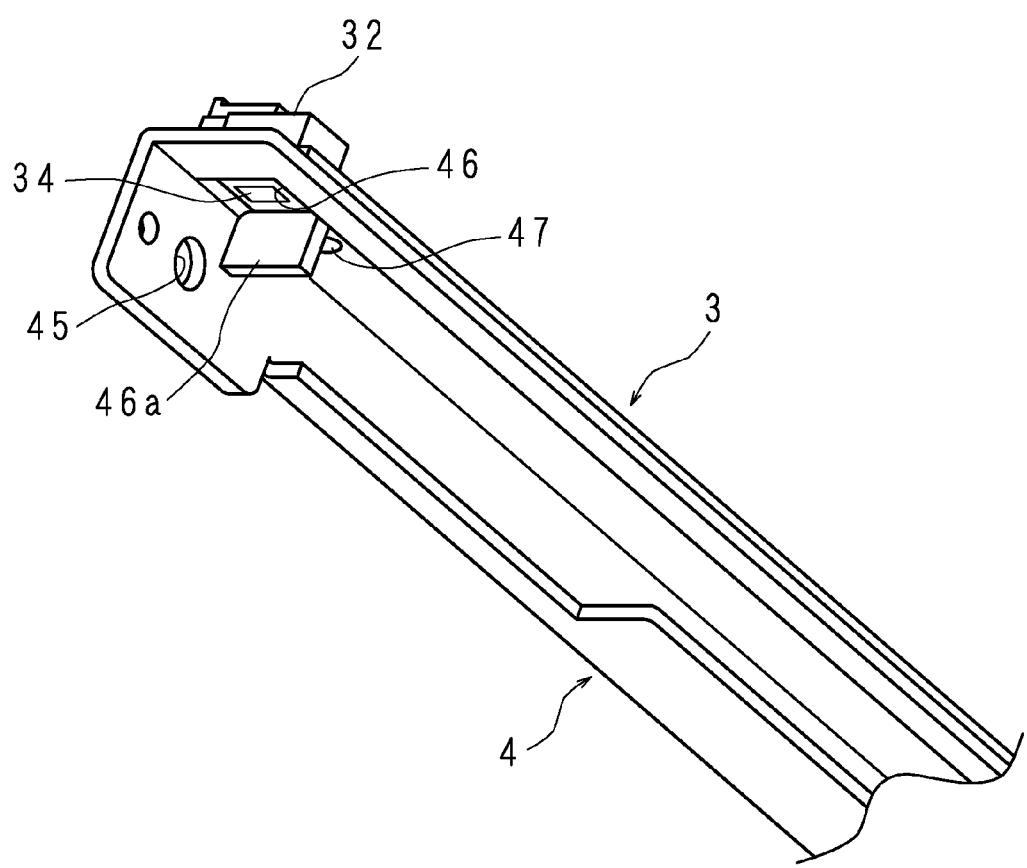
FIG. 17 is a partial perspective view of the heat spreader on which the light source module is placed as seen from the side face thereof.

In the above-described Embodiment 1, the heat spreader 4 is provided with the window portion 46. When forming the window portion 46, a portion of the surface corresponding to the heat spreader 4 is removed. In Modified Embodiment 3, a portion of the plate-shaped portion which is cut out to form the window portion 46 remains connected to a body of the heat spreader 4, rather than removing the same. FIG. 17 is a partial perspective view of the heat spreader 4 on which the light source module 3 is placed as seen from the side face thereof. A plate-shaped portion 46a, which is cut out to form the window portion 46, is inwardly bent in a state of being connected to the heat spreader 4.

As shown in FIG. 11, since the heat spreader 4 is coupled with the member 51 included in the holding frame 5, a hole to which the cut out plate-shaped portion 46a is fitted is formed in the member 51 at a position corresponding to the plate-shaped portion 46a.

In Modified Embodiment 3, instead of completely removing the plate-shaped portion 46a which is cut out to form the window portion 46, a portion thereof is kept in the connection state to the body of the heat spreader 4, so that the cut out plate-shaped portion 46a also servers to dissipate the heat generated from the light source module 3. In addition, since the hole to which the cut out plate-shaped portion 46a is fitted is formed in the member 51 at the position corresponding to the plate-shaped portion 46a, and the cut out plate-shaped portion 46a is fitted to the corresponding hole, it is possible to position the heat spreader 4 during assembling thereof.

Modified Embodiment 4

In the above-described Modified Embodiments 1 and 3, the heat spreader 4 is provided with the window portion 46, so as to be able to see the rank information 34 described on the light source module 3, in the state in which the light source module 3 is mounted on the heat spreader 4. Modified Embodiment 4 has a configuration in which a tip end of the heat spreader 4 is cut away, instead of the window portion 46. FIG. 18 is a partial perspective view of the heat spreader 4 on which the light source module 3 is placed as seen from the side face thereof. A notch portion 48 is formed in the tip end of the heat spreader 4 so as to have a U shape. By forming the notch portion 48, it is possible to read the rank information 34 described on the light source module 3. Meanwhile, unlike Modified Embodiment 1, since a member has remained on the tip end portion of the heat spreader 4, it is possible to also hold the tip end portion of the light source module 3 by the heat spreader 4.

The notch portion 48 is formed in a U shape, however, it is not limited thereto, and it may be formed in a catch fork shape or a fork shape.

In the above description, the number of the light source modules 3 mounted on the heat spreader 4 is not particularly mentioned, and one or a plurality of light source modules may be provided. In the case of providing the plurality of light source modules, it is preferable that two light source modules are provided considering the position of the connector 32. In this case, the light source modules 3 may have a symmetrical configuration. That is, when two light source modules 3 are fixed to the heat spreader 4, the light source modules are configured to be line symmetrical about longitudinal and lateral centers of the heat spreader 4. As shown in FIG. 6, one light source module 3 has the connector 32 located on the left side of the liquid crystal TV. The other light source module to be symmetrical therewith may have the connector located on the right side of the liquid crystal TV.

As described above, the heat spreader 4 and the holding frame 5 are screwed, but the way of connecting them is not limited thereto, and these parts may be fixed with an adhesive or a double-sided tape.

Further, in order to increase the amount of heat conducted to the holding frame 5 from the heat spreader 4, a configuration in which a heat conductive sheet (a thermal conductor) made of silicon, acrylic resin, carbon fiber, or the like is disposed between the heat spreader 4 and the holding frame 5 may be provided. Furthermore, the heat conductive sheet may be disposed between the heat spreader 4 and the backlight chassis 9.

In the above description, the heat spreader 4 is made of aluminum, but it is not limited thereto, and it may be made of any material having good thermal conductivity. For example, iron or stainless steel may be used. From an aspect of dissipating heat more efficiently, silver, copper, or the like is preferably used, but in consideration of costs, strength and ease of processing, aluminum, iron, or stainless steel is more preferably used.

The holding frame 5 and the backlight chassis 9 are assumed to be made of the steel plate, but in order to dissipate the heat of the white LEDs 30 better, aluminum, iron, or stainless steel may be used.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A display apparatus comprising:
   a substrate on which a light emitting element to supply light to a display panel for displaying an image on a front side thereof is mounted at one surface the substrate, which has information regarding the light emitting element described on another surface thereof;
   a heat dissipater which configured to mount the substrate has an opening portion formed in a surface thereof on which the substrate is mounted at a position corresponding to a position in which the information is described; and
   a holding frame which includes a placing portion which protrudes in a direction substantially perpendicular to a back surface of the display panel, and is long in a direction along a side face of the display panel, so that the heat dissipater is placed on the placing portion in a longitudinal direction thereof configured to hold a peripheral edge part of the display panel.

2. The display apparatus according to claim 1, wherein a connector is mounted on said one surface of the substrate to be connected with a conducting wire for supplying power to the light emitting element; and
   the information is described on said another surface of the substrate at a position corresponding to a position in which the connector is fixed.

3. The display apparatus according to claim 2, wherein the information is described on an end portion of the substrate.

4. A television receiving apparatus comprising:
   the display apparatus according to claim 3; and
   a tuner unit which receives television broadcasts,
   wherein the display apparatus is configured to display an image relating to the television broadcasts received by the tuner unit.

5. A television receiving apparatus comprising:
   the display apparatus according to claim 2; and
   a tuner unit which receives television broadcasts,
   wherein the display apparatus is configured to display an image relating to the television broadcasts received by the tuner unit.

6. The display apparatus according to claim 1, wherein the information is described on an end portion of the substrate.

7. A television receiving apparatus comprising:
   the display apparatus according to claim 6; and
   a tuner unit which receives television broadcasts,
   wherein the display apparatus is configured to display an image relating to the television broadcasts received by the tuner unit.

8. A television receiving apparatus comprising:
   the display apparatus according to claim 1; and
   a tuner unit which receives television broadcasts,
   wherein the display apparatus is configured to display an image relating to the television broadcasts received by the tuner unit.

* * * * *